United States Patent
Chaudhuri et al.

(10) Patent No.: US 6,802,446 B2
(45) Date of Patent: Oct. 12, 2004

(54) CONDUCTIVE ADHESIVE MATERIAL WITH METALLURGICALLY-BONDED CONDUCTIVE PARTICLES

(75) Inventors: Arun K. Chaudhuri, Carmel, IN (US); Frank Stepniak, Noblesville, IN (US); Matthew R. Walsh, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/060,812

(22) Filed: Feb. 1, 2002

(65) Prior Publication Data

US 2003/0146266 A1 Aug. 7, 2003

(51) Int. Cl.[7] .......................... B23K 31/00; H01L 21/44
(52) U.S. Cl. ................... 228/248.1; 228/175; 438/612; 252/512
(58) Field of Search ................ 438/612–614, 438/248.1; 228/175, 180.22, 180.21, 248.1; 252/512–514; 148/22–24

(56) References Cited

U.S. PATENT DOCUMENTS

| | | | | |
|---|---|---|---|---|
| 4,678,720 A | * | 7/1987 | Hsu et al. | 428/606 |
| 5,136,365 A | * | 8/1992 | Pennisi et al. | 257/783 |
| 5,151,777 A | | 9/1992 | Akin et al. | |
| 5,328,087 A | * | 7/1994 | Nelson et al. | 228/175 |
| 5,531,942 A | * | 7/1996 | Gilleo et al. | 264/5 |
| 5,573,602 A | * | 11/1996 | Banerji et al. | 148/24 |
| 5,672,226 A | | 9/1997 | Deardorf | |
| 5,830,389 A | * | 11/1998 | Capote et al. | 252/512 |
| 5,840,417 A | * | 11/1998 | Bolger | 428/323 |
| 5,853,622 A | * | 12/1998 | Gallagher et al. | 252/512 |
| 6,077,380 A | * | 6/2000 | Hayes et al. | 156/283 |
| 6,114,413 A | * | 9/2000 | Kang et al. | 523/210 |
| 6,149,857 A | * | 11/2000 | McArdle et al. | 264/429 |
| 6,260,264 B1 | * | 7/2001 | Chen et al. | 29/832 |
| 6,270,363 B1 | * | 8/2001 | Brofman et al. | 439/91 |
| 6,284,817 B1 | * | 9/2001 | Cross et al. | 523/220 |
| 6,410,415 B1 | * | 6/2002 | Estes et al. | 438/612 |
| 6,421,249 B1 | | 7/2002 | Trombley et al. | |
| 6,566,234 B1 | * | 5/2003 | Capote et al. | 438/458 |
| 6,614,659 B2 | | 9/2003 | Feigenbaum et al. | |
| 2002/0056925 A1 | * | 5/2002 | Kang et al. | 257/784 |
| 2002/0088540 A1 | * | 7/2002 | Chan et al. | 156/291 |

FOREIGN PATENT DOCUMENTS

| | | | | |
|---|---|---|---|---|
| DE | 42 28 608 A 1 | 3/1994 | | C09J/9/02 |
| EP | 1 138 737 A1 | 4/2001 | | C09J/163/00 |
| EP | 0933010 B1 | * | 1/2002 | |
| WO | WO 95/23416 | 8/1995 | | |

* cited by examiner

Primary Examiner—L. Edmondson
(74) Attorney, Agent, or Firm—Stefan V. Chmielewski

(57) ABSTRACT

A conductive adhesive material characterized by metallurgical bonds between electrically-conductive particles dispersed in a polymer matrix of the material. The polymer matrix has a fluxing capability when heated to reduce metal oxides on the surfaces of the particles. At least the outer surfaces of the particles are formed of a fusible material, so that sufficiently heating the conductive adhesive material will reduce metal oxides on the particles, and at least partially melt the fusible metal, enabling the particles to metallurgically bond to each other and to metal surfaces contacted by the adhesive material.

26 Claims, 3 Drawing Sheets

CONDUCTIVE ADHESIVE MATERIAL WITH METALLURGICALLY-BONDED CONDUCTIVE PARTICLES

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to conductive adhesives suitable for use in making electrical connections in electronic assemblies. More particularly, this invention relates to a conductive adhesive material whose composition enables electrically-conductive particles to be metallurgically bonded to each other and to metal surfaces contacted by the adhesive material during bonding, thereby promoting the electrical continuity and structural integrity of the resulting electrical connection.

(2) Description of the Related Art

Conductive adhesives (CA) have been used in electronic assemblies to make electrical connections, such as attaching components to circuit boards and within flexible and rigid circuit boards. Conductive adhesives can be categorized as isotropic (ICA) or anisotropic (ACA), the latter of which is also known as a z-axis conductive adhesive. ICA's generally comprise a polymer matrix of a thermosetting or thermoplastic material in which is dispersed small conductive particles that may be metal coated or formed entirely of metal. In ACA's, the conducting particles are typically solid metal or polymer spheres ultimately coated with a noble metal, usually gold. In a typical ICA application, a conductive adhesive is dispensed so as to be between a pair of terminals, such as a lead of a component and a trace on a substrate, and then heated to cure the polymer matrix, forming an interconnect that bonds and electrically connects the lead with the trace. In a typical ACA application, a film or paste adhesive with randomly dispersed conducting particles is tacked, printed or dispensed onto a substrate throughout the entire contact area.

Conductive adhesives suffer from several shortcomings, one of which is that the adhesive strength of existing conductive adhesives is generally inadequate to withstand mechanical shocks that can occur during the assembly process or in service. Another and more limiting disadvantage of conductive adhesives is that the conductive path through the interconnect is defined by the conductive particles that physically contact each other, but are bonded to each other and to the terminals by the polymer matrix of the adhesive. FIGS. 1 and 2 represent two types of interconnections that illustrate this shortcoming. In FIG. 1, an isotropic conductive adhesive 112 is shown as adhering the lead 114 of a surface-mount component (not shown) to a metal trace 116 on a laminate substrate 118, forming an electrical interconnect 110. The conductive adhesive 112 conventionally contains metal particles 120 dispersed in an adhesive matrix 122. The particles 120 are maintained in physical contact with each other, the lead 114 and the trace 116 by only the adhesive matrix 122. Consequently, the robustness of the electrical interconnect 110 is not determined by the conductivity of the individual particles 120, but instead by the interfacial conductivity between the particles 120 and between the particles 120, lead 114 and trace 116. Because the particles 120 inevitably oxidize due to oxygen and/or moisture intrusion into the adhesive matrix 122, an oxide layer is typically present at the interfacial surfaces of the particles 120. For this reason, the particles 120 are typically formed from a material whose oxide is conductive, such as silver. However, silver is expensive and silver migration is detrimental to the integrity of the electrical connection. Regardless of what material the particles 120 are formed of, the resulting conductive path through the interconnect 110 is not mechanically robust.

FIG. 2 illustrates the use of an anisotropic conductive adhesive 212, such as in the manufacture of a flat panel display. The adhesive 212 is shown as forming an interconnect 210 between an oxide-free metal post 214 on an I/O pad of a silicon chip 215 to an input/output trace 216 on a glass substrate 218. The conductive adhesive 212 contains conductive particles 220 (typically nickel or gold-coated polymer spheres or solid metals) dispersed in an adhesive matrix 222. As represented in FIG. 2, the standoff is on the order of the diameter of the particles 220 (made possible because the surfaces of the chip 215 and glass substrate 218 are extremely flat). As a result, interparticle resistance is not an issue with the interconnect 210. However, as with the isotropic interconnect 110 of FIG. 1, the particles 220 of the anisotropic interconnect 210 are maintained in physical contact with the metal post 214 and trace 216 by only the adhesive matrix 222. Consequently, the robustness of the electrical interconnect 210 is again primarily determined by the interfacial conductivity between each particle 220 and its corresponding die and metal substrate contacts. Any swelling of the adhesive matrix 222 or oxygen or moisture intrusion can reduce or interrupt the physical contact between the individual particles 220 and the die and substrate metals, increasing the electrical resistance of the interconnect 210 above that allowed for the application.

In view of the above, one can appreciate that in a relatively hostile environment, the interconnects 110 and 210 may electrically open or increase in resistance as a result of degradation or failure of the mechanical bond provided by their polymer adhesive matrices 122 and 222, such that device functionality can be compromised. A more robust interconnect system could be obtained by substituting the interparticle mechanical bonds with metallurgical bonds. However, previous attempts to use fusible alloys as the conductive particles of a conductive adhesive have been unsuccessful because of the aforementioned oxidation of the particles 122 and 222 which, in addition to significantly increasing the electrical resistance of the interconnects 110 and 210, prevents the particles 122 and 222 from wetting each other and the terminals when heated above the melting or solidus temperature of the particles 122 and 222. Without wetting, true metallurgical bonds cannot be obtained.

In view of the above, it can be appreciated that existing conductive adhesives are not suited for harsh environments as a result of their limited adhesive strength being inadequate to withstand mechanical shock and provide a robust electrical interconnect. Accordingly, it would be desirable of an electrical interconnect material were available to overcome the shortcomings of the prior art.

BRIEF SUMMARY OF THE INVENTION

The present invention provides a conductive adhesive material and a process by which the conductive adhesive material is used to produce an electrical interconnection characterized by metallurgical bonds between electrically-conductive particles, instead of the mechanical bonds of prior art conductive adhesives. The metallurgical bonds formed between conductive particles yields a more robust electrical interconnection that can more readily withstand mechanical shocks typical of assembly processes and operating environments.

According to the invention. the conductive adhesive material comprises the conductive particles and a polymer material in which the particles are dispersed. At least the outer surfaces of the conductive particles are formed of a fusible material, and the polymer material contains a fluxing component capable of reducing metal oxides on the surfaces of the particles. As a result, heating of the oxide-free particles to a temperature at which the fusible material is at least partially molten, e.g., near the melting temperature or above the solidus temperature of the fusible material, causes the particles to metallurgically bond to each other and to metal surfaces contacted by the adhesive material. The metallurgical bonds between particles provide superior electrical continuity and structural integrity as compared to the mechanical bonds provided by prior art conductive adhesives.

In view of the above, the present invention provides for forming an electrical interconnect by dispensing the conductive adhesive material so that the adhesive material is between two electrically-conductive members. The adhesive material is then sufficiently heated to cause metal oxides on the particles to be reduced and to at least partially melt the fusible metal that forms at least the outer surfaces of the particles. On cooling the conductive adhesive material, the particles are metallurgically bonded to each other and the electrically-conductive members. The assembly process can be conveniently separated into three events, namely, die placement, metallurgical joint formation, and polymer material cure/bond. The metallurgical joint formation may occur prior to polymer material cure/bond, or these two events can occur simultaneously, depending on the particular materials used for the fusible and polymer materials.

According to the invention, the metallurgical bonds formed between conductive particles enable the conductive adhesive material to withstand mechanical shocks typical of assembly processes and operating environments as a result of the improved strength provided by the metallurgical bonds as compared to the mechanical bonds of prior art conductive adhesives. The metallurgical bonds between particles also provide a more robust electrical interconnect that is capable of maintaining electrical continuity at higher current loads than that possible with a prior art conductive adhesive containing a similar amount of conductive particles. The metallurgical bonds also assuage degradation of electrical continuity caused by corrosion that occurs at the particle surfaces, including the interfacial particle surfaces of prior art conductive adhesives, as a result of the permeability of adhesive materials to oxygen and moisture and the ease of oxidation at the interface between abrading particles. Finally, because the continuous conductive path formed by the metallurgically-bonded particles is encapsulated by the polymer material, electrical interconnects formed with the conductive adhesive material of this invention are capable of exhibiting improved fatigue life as compared to conventional interconnections formed by solder alloys.

Other objects and advantages of this invention will be better appreciated from the following detailed description.

DETAILED DESCRIPTION OF THE INVENTION

Figure 3:
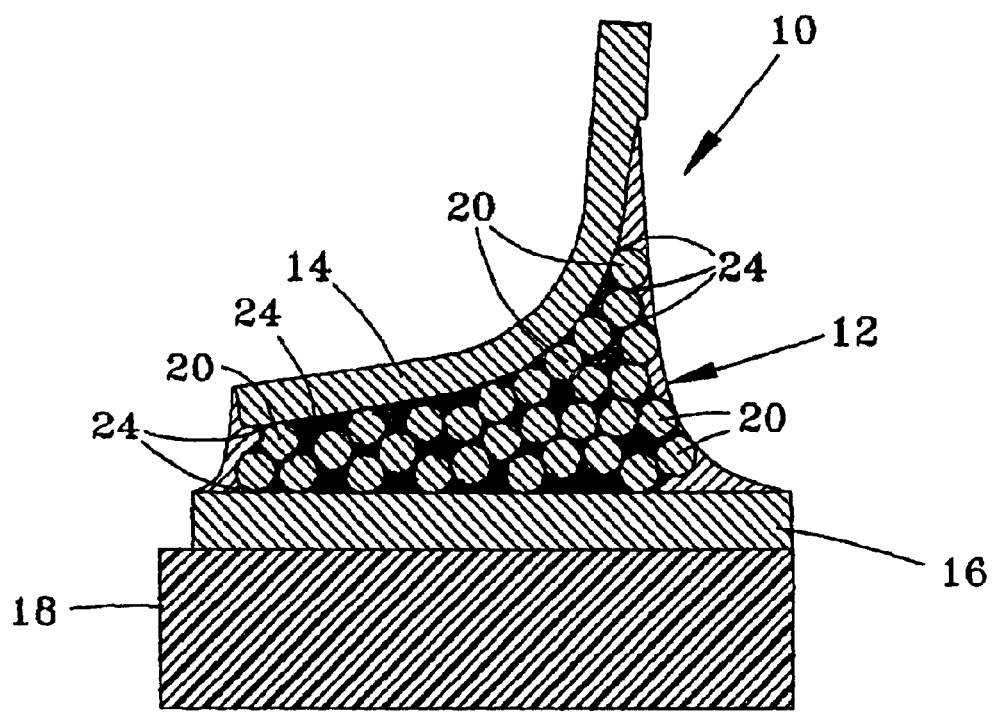
FIGS. 3, 4 and 5 represent three electrical interconnects formed with conductive adhesive materials in accordance with the present invention.
Figure 4:
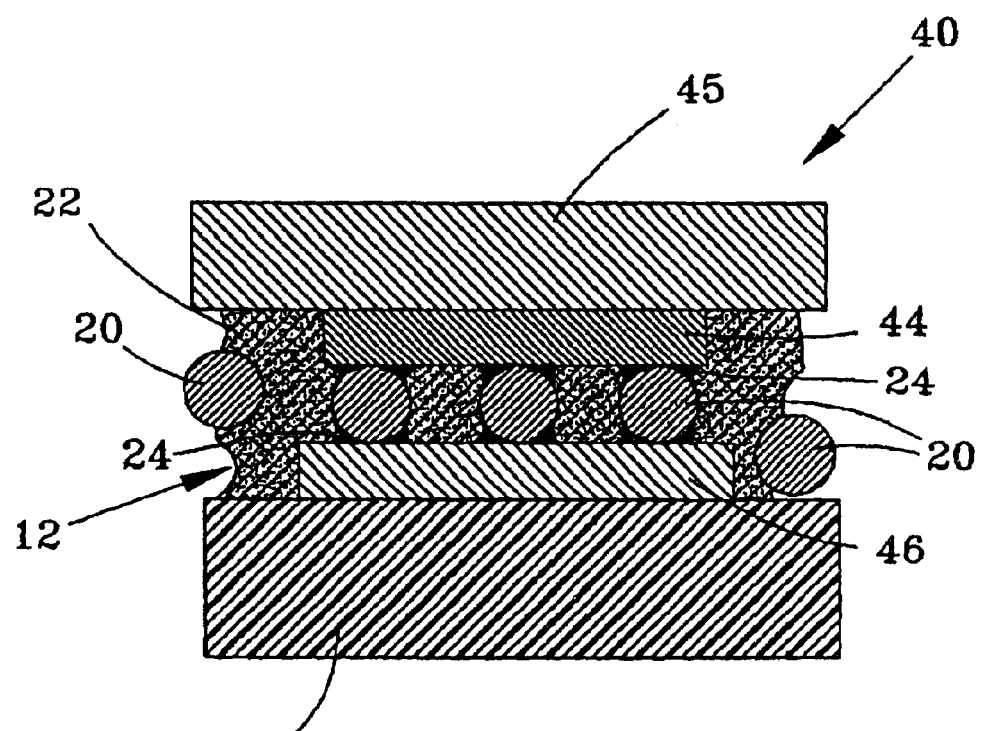
Figure 5:
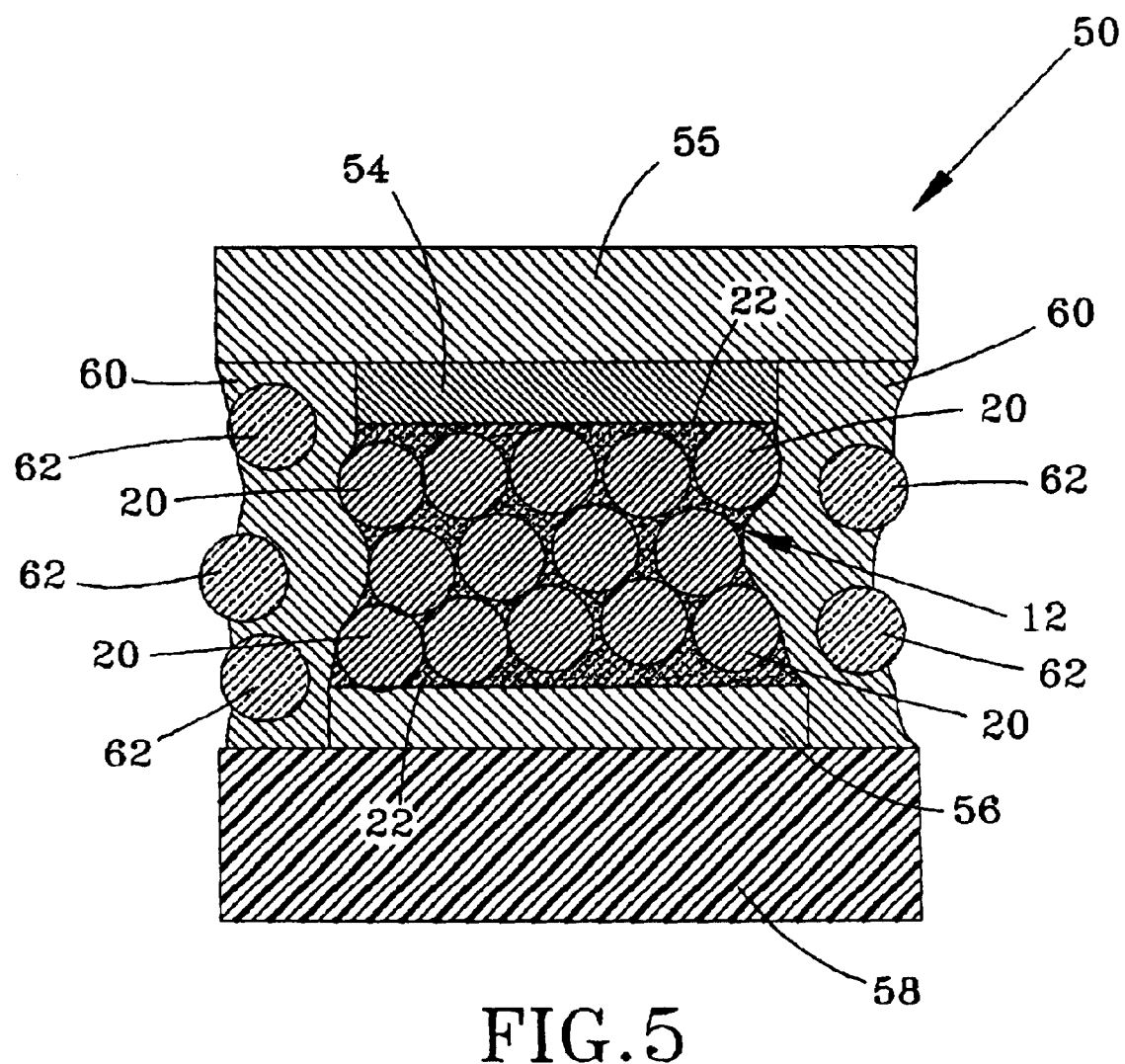

FIGS. 3 through 5 represent three electrical interconnects 10, 40 and 50 of types used to attach the leads or terminals of a component to a circuit board or other substrate, and formed with the use of a conductive adhesive material 12 formulated in accordance with the present invention. The conductive adhesive material 12 of each interconnect 10, 40 and 50 comprises conductive particles 20 dispersed in a polymer matrix 22. While the interconnects 10, 40 and 50 are shown for particular applications in which a component is mounted and attached to a substrate, those skilled in the art will appreciate that the conductive adhesive material 12 of this invention could also be employed to form interconnects within a substrate, such as in and between multiple layers of a circuit board.

In each of FIGS. 3 through 5, the conductive particles 20 are represented as being solid metal particles. More particularly, the conductive particles 20 are formed of a fusible metal, which is a term conventionally used to describe a low-melting temperature material, such as solder alloys containing lead, tin, bismuth, cadmium, indium, silver, copper and/or antimony. As will become apparent from the following discussion, the melting temperature (more properly, the solidus and liquidus temperatures if a noneutectic alloy) required of the particles 20 is related to the thermal performance of the polymer matrix 22, and therefore is not independently limited to any particular temperature range. While each particle 20 can be formed entirely of a fusible metal, it is also within the scope of the invention that some or all of the particles 20 could be formed to have a fusible metal coating over a core material that could be a high-temperature polymer or a metal with a solidus or melting temperature that is higher than the solidus or melting temperature of the fusible metal. Copper is a notable example of the latter type of core material.

The polymer matrix 22 of the conductive adhesive material 12 is formed of a polymerizable flux, also termed a flux adhesive, which means the polymer matrix 22 is formed of a material that provides a fluxing action. The term "flux" is used in its conventional sense to denote the ability to crack, displace and/or reduce oxides on a surface, such as the nonconductive oxides of tin and lead that form on tin-lead solders when exposed to moisture and oxygen at elevated temperatures. The elimination of oxides from a metal surface promotes the ability of the metal upon melting or softening to form a metallurgical bond with another metal, in this case, a metallurgical bond between the particles 20 of the conductive adhesive material 12. The polymer matrix 22 may be a thermoplastic or thermosetting polymer, or some combination thereof. Preferred materials for the polymer matrix 22 have a cure temperature in a range of about 150 to about 250° C., and a glass transition temperature at or above the application temperature of the component (e.g., 150° C.) in order to enhance the structural integrity of the interconnects 10, 40 and 50 at elevated temperatures. An example of a suitable flux adhesive is a fast cure epoxy in which functional groups of the monomer backbone have been modified to provide the fluxing action. One such epoxy is available from the 3M Corporation under the name UF3400, and has the advantageous property of being able to cure during brief thermal treatments typical of solder reflow conditions. This family of materials has the additional advantage of being able to activate the oxidized surface of a fusible metal without concomitant gas evolution, which would have the potential for compromising the reliability of the interconnects 10, 40 and 50 by the formation of voids in the adhesive material 12.

The assembly process of this invention can generally be viewed as including three events, namely, die placement, metallurgical joint formation, and adhesive cure/bond. The metallurgical joint formation may occur prior to curing of the polymer material, or these two events can occur simultaneously, depending on the particular fusible metal of the particles 20 and the particular material of the polymer matrix 22. The manner in which these steps occur will depend on the flexibility of the system assembly, and tradeoffs such as polymer cure rate or assembly speed. Metallurgical joint formation (i.e. characterized by a thermal cycle whose temperature and duration enable the fusible metal to reflow or otherwise sufficiently melt to permit metallurgical bonding between particles 20) generally occurs in a relatively short time frame and sets the maximum processing temperature. The polymer matrix 22 may be formulated to have cure kinetics that enable it to completely cure during joint formation, or if advantageous, to cure at a lower but longer anneal temperature after joint formation. For those skilled in the art, it will be recognized that the assembly process could occur in a single step, where die is placed under pressure and temperature, to both form the metallurgical joints and cure the polymer adhesive. However, it is believed that a more robust assembly process and/or improved polymer properties can be realized by decoupling the joint formation step from the polymer cure step. Increased throughput at die placement can be effected by allowing room temperature die placement, after which joint formation and polymer cure can occur together in a second operation performed within a reflow oven, or can be separated further to where each assembly event entails a distinct process step using different equipment.

In view of the above, suitable melting, solidus and liquidus temperatures for the particles 20 are dependent on the cure temperature of the polymer matrix 22. The melting properties of the particles 20 are also dependent on the particular type of electrical interconnect being formed. For example, in some applications it will be preferable that the particles 20 (or at least a fusible metal coating on the particles 20) are completely molten during the assembly process. Alternatively, it may be preferable that the particles 20 (or at least a fusible metal coating on the particles 20) have a paste-like consistency during assembly, necessitating that the fusible metal is a noneutectic alloy having a solidus temperature below the joint formation temperature and a liquidus temperature above the joint formation temperature. To illustrate the above, at a cure temperature of 230° C., particles of the Sn—Pb eutectic alloy (63 wt. % Sn, 37 wt. % Pb; melting point of about 183° C.) would be expected to collapse and coalesce (high wetting. low particle strength). Noneutectic Sn—Pb solder alloys have solidus temperatures of as low as 183° C. and liquidus temperatures ranging from 183° C. up to the melting point of lead (about 327° C.). At 230° C., Sn—Pb solder particles with a lead content of about 55 to 85 wt. % would be above their solidus temperature but below their liquidus temperatures, causing the particles to soften and have relatively lower wetting and higher particle strength as compared to eutectic Sn—Pb solder. For example, a Sn—Pb solder with a lead content of about 70 wt. % has a solidus temperature of about 183° C. and a liquidus temperature of about 270° C. Heating to 230° C. causes the particles 20 to have a paste-like consistency characterized by moderate wetting and moderate particle shape retention. For a given assembly temperature, modification of the solder alloy composition toward a higher lead content (e.g., closer to 85 wt. % Pb) would result in particles 20 that exhibit less wetting and higher mechanical strength as compared to particles 20 composed of lower lead content (e.g., closer to 55 wt. % Pb). Consequently, the composition of the particles 20 can be tailored to enable control over the degree of wetting and deformation (slumping) of individual particles 20, and therefore the shape and standoff height of the resulting interconnect. Shape retention (resistance to deformation) can be promoted if the particles 20 are only coated with the fusible metal, such as copper particles coated with a near-eutectic Sn—Pb alloy so that the particles 20 maintain their shape while allowing metallurgical bonding through complete melting of only their fusible metal coatings.

While bonding conditions and operating environments will vary depending on the particular application, solder alloys with a melting temperature (MP) or a solidus or liquidus temperature within a range of about 175° C. to about 250° C. are generally believed to be particularly suitable for use with this invention, depending on the composition of the polymer matrix 22. Candidate fusible metals include the Sn—Pb solders noted above, as well as other fusible metals and metal alloys composed of lead, tin, bismuth, cadmium, indium, silver, copper and/or antimony. A particularly suitable fusible metal for use with the UF3400 material is the eutectic Sn—Pb alloy, with a melting temperature of about 183° C. Importantly, the electrical conductivity of the oxide(s) of the fusible metal is not relevant to the selection of the composition of the particles 20, since the polymer matrix 22 is specifically formulated to displace and/or reduce oxides during bonding of the conductive adhesive material 12. As a result, oxides originally present on the particles 20 do not interfere with the metallurgical bonding of the particles 20. Furthermore, the metallurgical bonds between the particles 20 eliminate the interfacial contact surfaces between particles 20, so that any subsequent oxidation of the surfaces of the particles 20 will not affect the electrical conductivity of the interconnect. In summary, as a result of the metallurgical bonds made possible with this invention, the corrosion process that occurs on the surfaces of the particles 20 as a result of oxygen and water intrusion has little effect on the overall electrical continuity and reliability of the interconnect.

Properties of the conductive adhesive material 12 and the resulting interconnect (e.g., interconnects 10, 40 and 50) can also be tailored by the particle size and packing density, as well as the fluxing strength and cure dynamics of the polymer matrix 22. In applications where the conductive adhesive material 12 is to replace solder paste for a surface-mount plastic package, the material 12 should contain a sufficient quantity of particles 20 to ensure that the particles 20 will make large-scale metallurgical contacts. For this purpose, the particles 20 would preferably constitute about 10 to about 60 volume percent of the conductive adhesive material 12. However, it is foreseeable that greater and lesser quantities of particles 20 could be used. A suitable size for the particles 20 is believed to be on the order of about 5 micrometers to about 0.5 millimeter, with preferred sizes being about ten micrometers for particles used in ACA applications and about twenty-five micrometers for ICA applications. The composition, size and packing density of the particles 20 and the fluxing strength and cure dynamics of the polymer matrix 22 can also be tailored to vary the geometry of the interconnect, such as to promote greater z-axis conductivity or greater x-y-axis isolation, as will become apparent from the following discussion.

Figure 1:
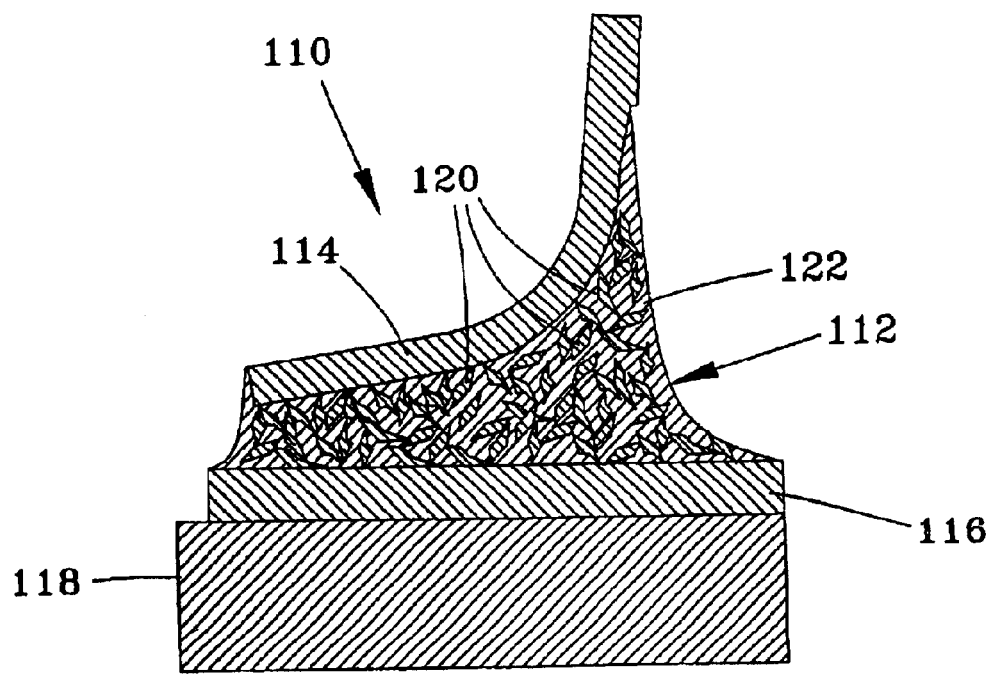
FIGS. 1 and 2 represent two types of electrical interconnects formed with conductive adhesive materials of the prior art.
Figure 2:
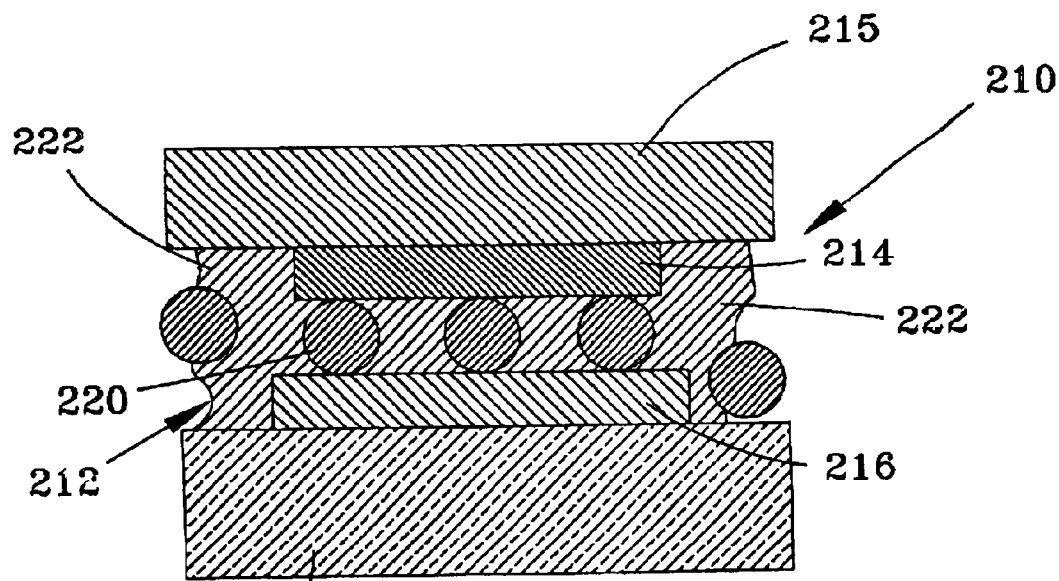

With reference to FIG. 3, the conductive adhesive material 12 of this invention is represented as forming the electrical interconnect 10 for a surface-mount device whose lead 14 is bonded with the material 12 to a metal trace 16 on a substrate 18. The adhesive material 12 fills the space between the lead 14 and trace 16, and the particles 20 contact each other, the lead 14 and the trace 16 to define a continuous electrical path through the interconnect 10. As such, FIG. 3 represents an isotropic application for the conductive adhesive material 12. According to this invention, the interconnect 10 differs from interconnects formed by conductive adhesives of the prior art by the presence of metallurgical bonds 24 between individual particles 20 and between individual particles 20 and the lead 14 and trace 16. These bonds 24 can be formed by completely or partially melting the particles 20. The resulting improvement in conductivity between particles 20 and between particles 20 and the lead 14 and trace 16 is a distinct advantage over prior art ICA technology, a significant shortcoming of which is the relatively high electrical resistance resulting from only physical interfacial contact between particles (e.g., FIG. 1).

FIG. 4 represents an anisotropic application for the conductive adhesive material 12, such as in the manufacture of flat panel displays with very flat substrates (e.g., glass) and very fine input/output trace pitches (e.g., 0.1 mm or less). As illustrated, the electrical interconnect 40 bonds a cap metal 44 of a silicon chip 45 to a metal trace 46 on a substrate 48. The adhesive material 12 fills the entire space between the chip 45 and the substrate 48, and the individual particles 20 define separate electrical paths between the cap metal 44 and the metal trace 46. In such an application, the resistance between conductive particles 20 is not an issue because the standoff for flat panel displays is on the order of a particle diameter (e.g., about ten micrometers), and the particles 20 are separated to avoid short circuiting in the x-y plane. In the assembly process, pressure is typically applied to the particles 20 through the chip 45 while the conductive adhesive material 12 is held at a suitable bonding temperature for the polymer matrix. As such, in the embodiment of FIG. 4 the particles 20 are preferably formed to have a fusible metal coating over a core material with a higher melting temperature than the bonding temperature, so that the particles 20 do not coalesce or collapse during bonding.

Finally, FIG. 5 illustrates an isotropic application involving a direct chip attach (DCA) solder interconnect 50. Similar to the embodiment of FIG. 4, the electrical interconnect 50 is illustrated as bonding solder-compatible contact metals 54 of a silicon chip 55 to one of multiple metal traces 56 on a substrate 58. In the illustrated DCA application, the standoff height must be greater than a single particle diameter (e.g., greater than about 25 micrometers) due to the topography of the substrate 58 and because the pitch of the I/O traces 56 is on the order of about 0.25 mm. The interconnect 50 consists of a mass of the particles 20 metallurgically bonded together and encapsulated in the polymer matrix 22, while an underfill material 60 containing nonconducting filler particles 62 fills the space surrounding the interconnect 50 and between the chip 45 and substrate 48. For this application, the conductive adhesive material 12 would be highly filled and stencil printed on the substrate 58, the chip 55 placed on the substrate 58 at the I/O locations provided by the traces 56, and then the resulting assembly heated to cause melting and coalescing of the particles 20 (or at least a fusible metal coating on the particles 20).

In view of the above, the present invention can be seen to overcome various shortcomings of existing conductive adhesive materials to provide a robust electrical interconnection. In ICA applications, the fluxing action of the polymer matrix 22 enables metallurgical bonding of the conductive particles 20 with each other and terminals bonded with the adhesive conductive material 12, thereby reducing contact resistance. In the case of ACA applications, the invention allows for the use of particles 20 that have a fusible metal coating over a core formed of a material with a higher melting temperature than the fusible metal coating. In this manner, coalescing and collapse of the particles 20 can be avoided even if pressure is applied, while still achieving metallurgical particle-to-particle bonding to yield a robust and typical solder-like interconnect.

While the invention has been described in terms of a preferred embodiment, it is apparent that other forms could be adopted by one skilled in the art. Accordingly, the scope of the invention is to be limited only by the following claims.

What is claimed is:

1. A conductive adhesive material consisting essentially of electrically-conductive particles and a polymer material in which the particles are dispersed, all of the electrically-conductive particles dispersed in the polymer material consisting essentially of a solder alloy that begins to melt at a temperature such that at least the outer surface of each of the electrically-conductive particles begins to melt at the temperature, the solder alloy containing at least one metal that has a nonconductive oxide, the polymer material having a fluxing capability for reducing the nonconducting oxide on the outer surfaces of the electrically-conductive particles when the conductive adhesive material is heated to the temperature at which the solder alloy begins to melt, whereby heating the conductive adhesive material to the temperature at which the solder alloy begins to melt causes metallurgical bonding of a plurality of the electrically-conductive particles to form at least one continuous conductive path through the polymer material.

2. A conductive adhesive material comprising electrically-conductive particles and a polymer material in which the particles are dispersed, each of the particles having a nonmetallic core material and an outer coating on the core material, the outer coating being formed of a solder alloy containing at least one metal that has a nonconductive oxide, the polymer material having a fluxing capability for reducing the nonconducting oxide on the outer surfaces of the particles while being heated to a temperature at which the solder alloy is at least partially molten, whereby heating the conductive adhesive material to at least partially melt the solder alloy and reduce the nonconducting oxide on the particles enables metallurgical bonding of a plurality of the particles to form at least one continuous conductive path through the polymer material.

3. The conductive adhesive material according to claim 1, wherein the polymer material has a cure temperature below the temperature at which the solder alloy begins to melt.

4. The conductive adhesive material according to claim 1, wherein the conductive adhesive material has metallurgical joint formation parameters that include a thermal cycle with a temperature range and time range required for the solder alloy to metallurgically bond the electrically-conductive particles together, and wherein the polymer material is characterized by cure kinetics that enable the polymer material to cure within the temperature and time ranges of the thermal cycle.

5. The conductive adhesive material according to claim 4, wherein the solder alloy has a liquidus temperature below the temperature range of the thermal cycle.

6. The conductive adhesive material according to claim 4, wherein the solder alloy has a liquidus temperature above the temperature range of the thermal cycle.

7. The conductive adhesive material according to claim 2, wherein the solder alloy is completely molten at a curing temperature of the polymer material.

8. The conductive adhesive material according to claim 2, wherein the solder alloy has a liquidus temperature above a curing temperature of the polymer material.

9. The conductive adhesive material according to claim 2, wherein the conductive adhesive material has metallurgical joint formation parameters that include a thermal cycle with a temperature range and time range required for the solder alloy to metallurgically bond the electrically-conductive particles together, and wherein the polymer material is characterized by cure kinetics that enable the polymer material to cure within the temperature and time ranges of the thermal cycle.

10. The conductive adhesive material according to claim 2, wherein the polymer material has a cure temperature below the temperature at which the solder alloy begins to melt.

11. A method of forming an electrical interconnect with a conductive adhesive material, the method comprising the steps of:

forming the conductive adhesive material to consist essentially of a polymer material in which electrically-conductive particles are dispersed, all of the electrically-conductive particles dispersed in the polymer material comprising a nonmetallic core and an outer coating formed of a solder alloy that begins to melt at a temperature such that at least the outer surface of each of the electrically-conductive particles begins to melt at the temperature, the solder alloy containing at least one metal that has a nonconductive oxide, the polymer material having a fluxing capability to reduce the nonconducting oxide on the electrically-conductive particles when the polymer material is heated;

dispensing the conductive adhesive material so that the conductive adhesive material is between a pair of electrically-conductive members;

heating the conductive adhesive material to a temperature sufficient to cause the nonconducting oxide on the electrically-conductive particles to be reduced and at least partially melt the solder alloy of each of the electrically-conductive particles dispersed in the polymer material; and cooling the conductive adhesive material to yield the electrical interconnect, a plurality of the electrically-conductive particles being metallurgically bonded to the electrically-conductive members and forming at least one continuous conductive path through the polymer material.

12. The method according to claim 11, wherein the beating step comprises a single heat treatment during which the solder alloy is at least partially melted and the polymer material is cured.

13. A method of forming an electrical interconnect with a conductive adhesive material, the method comprising the steps of:

forming the conductive adhesive material of a polymer material in which electrically-conductive particles are dispersed, at least the outer surface of each of the particles being formed of a solder alloy containing at least one metal that has a nonconductive oxide, the polymer material having a fluxing capability to reduce the nonconducting oxide on the particles when the polymer material is heated;

dispensing the conductive adhesive material so that the conductive adhesive material is between a pair of electrically-conductive members;

heating the conductive adhesive material to a temperature sufficient to cause the nonconducting oxide on the particles to be reduced and at least partially melt the solder alloy, wherein the heating step comprises a first joint formation heat treatment during which the solder alloy is at least partially melted, and a second and longer heat treatment at a lower temperature and during which the polymer material is cured; and cooling the conductive adhesive material to yield the electrical interconnect, a plurality of the particles being metallurgically bonded to the electrically-conductive members and forming at least one continuous conductive path through the polymer material.

14. The method according to claim 11, wherein the solder alloy is completely melted during the heating step.

15. The method according to claim 11, wherein the solder alloy is only partially melted during the heating step.

16. The method according to claim 11, wherein the solder alloy has a liquidus temperature above the temperature to which the conductive adhesive material is heated during the heating step, such that the solder alloy is only partially melted during the heating step.

17. The method according to claim 11, wherein following the cooling step the electrically-conductive particles are metallurgically bonded together.

18. A method of forming an electrical interconnect with a conductive adhesive material, the method comprising the steps of:

forming the conductive adhesive material of a polymer material in which electrically-conductive particles are dispersed, at least the outer surface of each of the particles being formed of a solder alloy containing at least one metal that has a nonconductive oxide, the polymer material having a fluxing capability to reduce the nonconducting oxide on the particles when the polymer material is heated;

dispensing the conductive adhesive material so that the conductive adhesive material is between a pair of spaced-apart electrically-conductive members;

heating the conductive adhesive material to a temperature sufficient to cause the nonconducting oxide on the particles to be reduced and at least partially melt the solder alloy; and cooling the conductive adhesive material to yield the electrical interconnect, a plurality of the particles being metallurgically bonded to the electrically-conductive members and forming at least one continuous conductive path through the polymer material, wherein the electrically-conductive members are spaced apart so that after the cooling step the electrically-conductive particles are not metallurgically bonded together but at least one of the electrically-conductive particles is metallurgically bonded to each of the electrically-conductive members.

19. The method according to claim 13, wherein the electrically-conductive particles are entirely formed of the solder alloy.

20. The method according to claim 13, wherein the solder alloy is present as an outer coating on the electrically-conductive particles, the electrically-conductive particles further comprising a core with a solidus or melting temperature that is higher than a solidus or melting temperature of the solder alloy.

21. The method according to claim 13, wherein following the cooling step the electrically-conductive particles are metallurgically bonded together.

22. The method according to claim 11, wherein the electrically-conductive members of the electrical component and the surface are spaced apart so that after the cooling step the electrically-conductive particles are not metallurgically bonded together but at least one of the electrically-conductive particles is metallurgically bonded to each of the electrically-conductive members of the electrical component and the surface.

23. The conductive adhesive material according to claim 1, wherein each particle of the plurality of electrically-conductive particles individually forms a continuous conductive path through the polymer material, such that a plurality of continuous conductive paths are present through the polymer material.

24. The conductive adhesive material according to claim 2, wherein each particle of the plurality of electrically-conductive particles individually forms a continuous conductive path through the polymer material, such that a plurality of continuous conductive paths are present through the epoxy adhesive.

25. A method of forming an electrical interconnect with a conductive adhesive material, the method comprising the steps of:

forming the conductive adhesive material of a polymer material in which electrically-conductive particles are dispersed, all of the electrically-conductive particles dispersed in the polymer material comprising a solder alloy that begins to melt at a temperature such that at least the outer surface of each of the electrically-conductive particles begins to melt at the temperature, the solder alloy containing at least one metal that has a nonconductive oxide, the polymer material having a fluxing capability to reduce the nonconducting oxide on the electrically-conductive particles when the polymer material is heated;

dispensing the conductive adhesive material so that the conductive adhesive material is between a pair of electrically-conductive members;

heating the conductive adhesive material to a temperature sufficient to cause the nonconducting oxide on the electrically-conductive particles to be reduced and at least partially melt the solder alloy of each of the electrically-conductive particles dispersed in the polymer material; and cooling the conductive adhesive material to yield the electrical interconnect, a plurality of the electrically-conductive particles being metallurgically bonded to the electrically-conductive members, wherein each particle of the plurality of electrically-conductive particles individually forms a continuous conductive path through the polymer material, such that a plurality of continuous conductive paths are present through the polymer material.

26. The method according to claim 13, wherein each particle of the plurality of electrically-conductive particles individually forms a continuous conductive path through the polymer material, such that a plurality of continuous conductive paths are present through the epoxy adhesive.

* * * * *